United States Patent [19]
Collier et al.

[11] Patent Number: 5,052,050
[45] Date of Patent: Sep. 24, 1991

[54] DIRECT CONVERSION FM RECEIVER

[75] Inventors: Christopher J. Collier, Carshalton Beeches; Robert A. Brown, Canbridge, both of England; Monique G. M. Sommer, Eindhoven, Netherlands

[73] Assignee: U.S. Philips Corp., New York, N.Y.

[21] Appl. No.: 323,465

[22] Filed: Mar. 14, 1989

[30] Foreign Application Priority Data

Mar. 16, 1988 [GB] United Kingdom ............... 8806202

[51] Int. Cl.$^5$ .......................... H04B 1/10; H04B 1/26
[52] U.S. Cl. .................... 455/296; 329/327; 375/39; 455/304; 455/309; 455/324
[58] Field of Search ............ 455/304, 306, 309, 317, 455/319, 324, 323, 296, 337; 329/306, 323, 327, 346, 361; 375/39, 76, 77, 84, 99, 102

[56] References Cited

U.S. PATENT DOCUMENTS

| | | | |
|---|---|---|---|
| 3,568,067 | 3/1971 | Williford | 325/320 |
| 3,990,016 | 11/1976 | Dimon | 329/135 |
| 4,090,145 | 5/1978 | Webb | 329/1 |
| 4,449,222 | 5/1984 | Crosset, III et al. | 375/10 |
| 4,560,941 | 12/1985 | Welles, II et al. | 329/50 |
| 4,675,882 | 6/1987 | Lillie et al. | 375/80 |
| 4,731,796 | 3/1988 | Masterton et al. | 375/9 |
| 4,766,392 | 8/1988 | Moore | 329/124 |
| 4,878,251 | 10/1989 | Richardson | 455/206 |
| 4,955,078 | 9/1990 | Chung | 455/244 |

Primary Examiner—Reinhard J. Eisenzopf
Assistant Examiner—Chi H. Pham
Attorney, Agent, or Firm—Steven R. Biren

[57] ABSTRACT

A direct conversion receiver for demodulating an FM signal converted frequency down converts the signal to quadrature related baseband signals (I,Q). These signals are applied by way of respective d.c. blocking capacitors (16, 18) and differentiating circuits (26, 28) to a differential arctan demodulator (20). The action of the differentiating circuits (26, 28) is to remove any d.c. component in the I and Q signals and to perform a frequency shaping which enables the demodulator (20) to recover correctly the modulating information. Measures are disclosed to overcome the effects of 180 degree phase jumps which will occur when the direction of rotation of the phasor reverses and of frequency dependent amplitude scaling introduced into the differentiated signals (I′, Q′).

9 Claims, 3 Drawing Sheets

DIRECT CONVERSION FM RECEIVER

BACKGROUND OF THE INVENTION the invention relates to a direct conversion receiver in which an FM signal is frequency down-converted in mixers to quadrature related I and Q signals at baseband frequencies, which signals are applied to demodulating means in which the modulation in the FM signal is recovered by obtaining the differential with respect to time of the arctan of the I and Q signals. A typical prior-art FM detector using a quadrature detector circuit, an arctan A/D converter, and a derivative circuit is shown in U.S. Pat. No. 4,603,300.

An advantage of a direct conversion receiver (or zero-IF receiver) architecture in which the incoming RF signal is mixed directly down to baseband over a superheterodyne receiver architecture is that all the channel amplification and filtering can be performed at baseband, which makes the direct conversion receiver suitable for integration. However, one of the problems with a direct conversion receiver is that a d.c. offset voltage will appear at the mixer output in addition to the wanted baseband signal. This d.c. offset can be much greater in amplitude than the wanted signal and so must be removed. It can be eliminated by a.c. coupling the mixer output, but this will also remove the wanted d.c. component produced by the down-converted carrier and in addition will introduce phase distortion in the baseband quadrature related signals. These two effects caused by a.c. coupling make it difficult to FM demodulate the incoming signal. The FM demodulation is performed by calculating the arctan of the I and Q channel signals. This unwanted d.c. component arises from d.c. offsets within the mixer and from the mixing down to d.c. of local oscillator leakage from the local oscillator to the r.f. port of mixer. A good double balanced diode ring mixer may have a LO-RF isolation of typically 40 dB and a d.c. offset of about 1 mV. This d.c. term can be much greater in amplitude than the wanted signal and would cause the post-mixer amplifiers and filters to saturate and so it must be removed.

The unwanted d.c. component is not constant, but will vary with local oscillator frequency and power level, and so it cannot be nulled out easily. It can be eliminated by a.c. coupling the mixer output, but this also removes the wanted d.c. component produced by the down-converted carrier. This wanted d.c. component depends on the phase of the incoming carrier with respect to that of the local oscillator. The consequence of removing the wanted d.c. component is that the values of the I and Q channel signals, representing the phase of the r.f. signal, will be incorrect after a.c. coupling. Thus frequency detection methods which are based on phase detection followed by a differentiation will fail, since an incorrect phase is detected.

A further problem is caused by the fact that the a.c. coupling has to be carried out in the analog part of the circuit, before analog to digital (A/D) conversion, because the A/D converters have a limited dynamic range. Therefore, a filter which carries out the a.c. coupling will be an analog high pass filter. Such a type of filter will cause a frequency dependent phase shift in the I and Q channel signals, which will also distort the output signal severely if frequency detection, based on phase detection followed by differentiation, is used.

SUMMARY OF THE INVENTION

An object of the present invention is to overcome these disadvantages in a.c. coupling the mixer outputs of a direct conversion receiver.

According to the present invention there is provided a direct conversion receiver characterized by an input for an FM signal, means coupled to the input for producing frequency down-converted quadrature related I and Q signals at baseband frequencies on respective first and second outputs, demodulating means having first and second inputs for receiving the I and Q signals and demodulating the information in the FM signal by obtaining the differential with respect to time of the arctan of the I and Q signals, and first and second differentiating means, said first and second outputs being coupled to the first and second differentiating means respectively, said first and second differentiating means having outputs coupled respectively to said first and second inputs of the demodulating means.

The present invention is based on the realization that the d.c. component present in the I and Q signals in the d.c. coupled case depends on the phase of the incoming carrier with respect to that of the local oscillator, and that with FM it is the rate of change of phase and not the absolute phase which carries the modulation. Therefore the I and Q channels can be differentiated in first and second differentiators as an initial step in the signal processing. The action of the differentiators removes any d.c. component from the I and Q signals and performs a frequency shaping which enables the demodulator to recover correctly the modulating information. Therefore d.c. blocking can be used without removing any wanted information.

The first and second differentiating means may comprise analog or digital differentiators. Analog differentiators will provide d.c. blocking on their own. However if there is a risk of the first and second differentiating means being saturated then it is preferable to have separate capacitors in the coupling to the inputs of the first and second differentiating means.

In the case of using digital differentiators these have to be preceded by a.c. coupled analog to digital converters. The digital differentiator may comprise a Finite Impulse Response (FIR) filter.

The provision of the first and second differentiating means can lead to two undesirable effects. First, 180 degree phase jumps will occur when the direction of rotation of the phasor reverses. In the receiver made in accordance with the present invention these phase jumps can be eliminated by ensuring that the phasor always lies in the region (−90 degrees, 90 degrees). This may be done by inverting the signs of the differentiated I and Q signals, denoted by I' and Q', when the phase is between −180 degrees and −90 degrees or between 90 degrees and 180 degrees, thereby rotating the phasor through 180 degrees and so placing it in the required region.

Second, differentiating the I and Q signals introduces a frequency dependent scaling into the I' and Q' signals. When the frequency is low the amplitude of the signals is small, which leads to an erroneous calculation of the phase. This effect can be limited by setting a threshold and determining when the amplitude of both the I' and Q' signals is lower than the threshold. When this occurs linear interpolation may be performed between two reliable values and/or the output of the demodulating means may be set to zero.

BRIEF DESCRIPTION OF THE DRAWING

The present invention will now be explained and described, by way of example, with reference to the accompanying drawings, in which.

Figure 1:
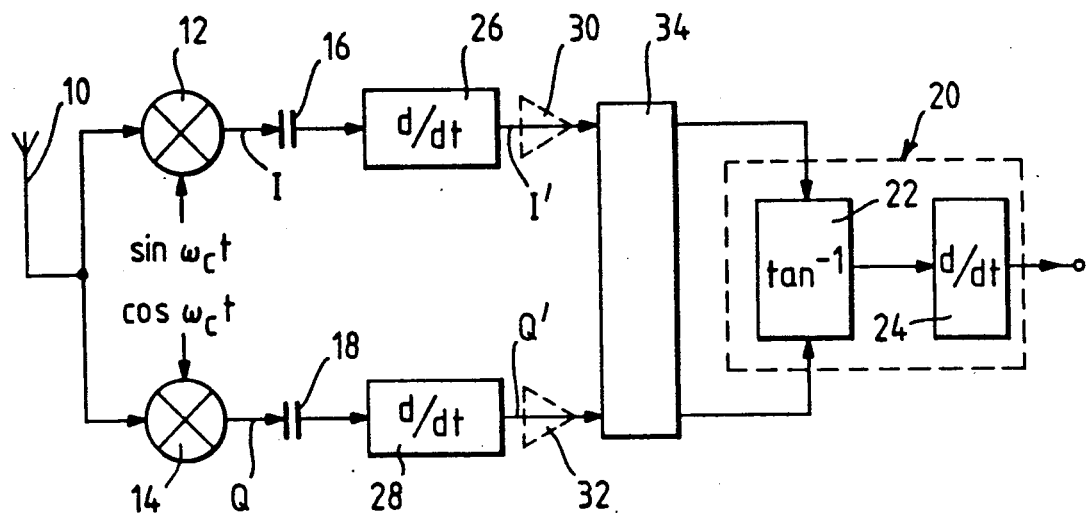
FIG. 1 is a block schematic diagram of an embodiment of the present invention.

In the drawings, the same references have been used to indicate corresponding features.

DESCRIPTION OF THE PREFERRED EMBODIMENTS

The direct conversion receiver shown in FIG. 1 comprises an antenna 10 which is connected to first and second mixers 12, 14 to which local oscillator signals sin $\omega_c t$ and cos $\omega_c t$ are applied, respectively. The local oscillator signals have a frequency corresponding to or slightly offset from the carrier frequency of an FM signal received at the antenna 10. As a result of the mixing and subsequent low pass filtering quadrature related signals I, Q are obtained at baseband or zero-IF frequencies.

In an alternative arrangement of this RF front end section of the receiver, known per se, the RF signal applied to the mixer 14 has a relative phase shift of 90 degrees compared to that of the RF signal applied to the mixer 12 and the local oscillator signals are of the same phase.

Capacitors 16, 18 are connected in the signal paths from the mixers 12, 14, respectively. The capacitors 16, 18 provide a.c. coupling between the mixers 12, 14 and the remainder of the receiver circuit and in so doing remove unwanted d.c. offsets present in the I and Q signals. However the capacitors 16, 18 also remove a wanted d.c. component produced by frequency downconverting the received FM signal which will prevent satisfactory operation of the demodulator 20. Also the capacitors 16, 18 will introduce phase distortion into the I and Q signals which lead to some distortion of the demodulated signal.

The demodulator 20 functions to obtain the differential with respect to time of the arctan (or $\tan^{-1}$) of the signals applied to its input. The demodulator 20 shown comprises a device 22 for obtaining an approximation of the arctan which is then applied to a differentiator 24. The device 22 may comprise a processor for implementing the CORDIC algorithm, this algorithm is disclosed in "The CORDIC Trigonometric Computing Technique" Jack E. Volder, IRE Transactions on Electronic Computers, VOL EC-8 No. 3 (1959), pages 330 and 334. Alternatively the demodulator 20 may be implemented to approximate the differential arctan function directly. Algorithms for implementing arctan cannot function correctly when the I and Q signals are simply a.c. coupled to the demodulator 20.

This problem is mitigated in the direct conversion receiver made in accordance with the present invention by providing differentiating circuits 26, 28 in the signal paths from the capacitors 16, 18 to the respective inputs of the demodulator 20. The action of the differentiating circuits 26, 28 is to remove any d.c. component from the I and Q signals and to perform a frequency shaping which enables the demodulator to recover correctly the modulating information. If desired gain stages 30, 32 may be connected to the signal outputs of the differentiating circuits 26, 28.

Figure 2:
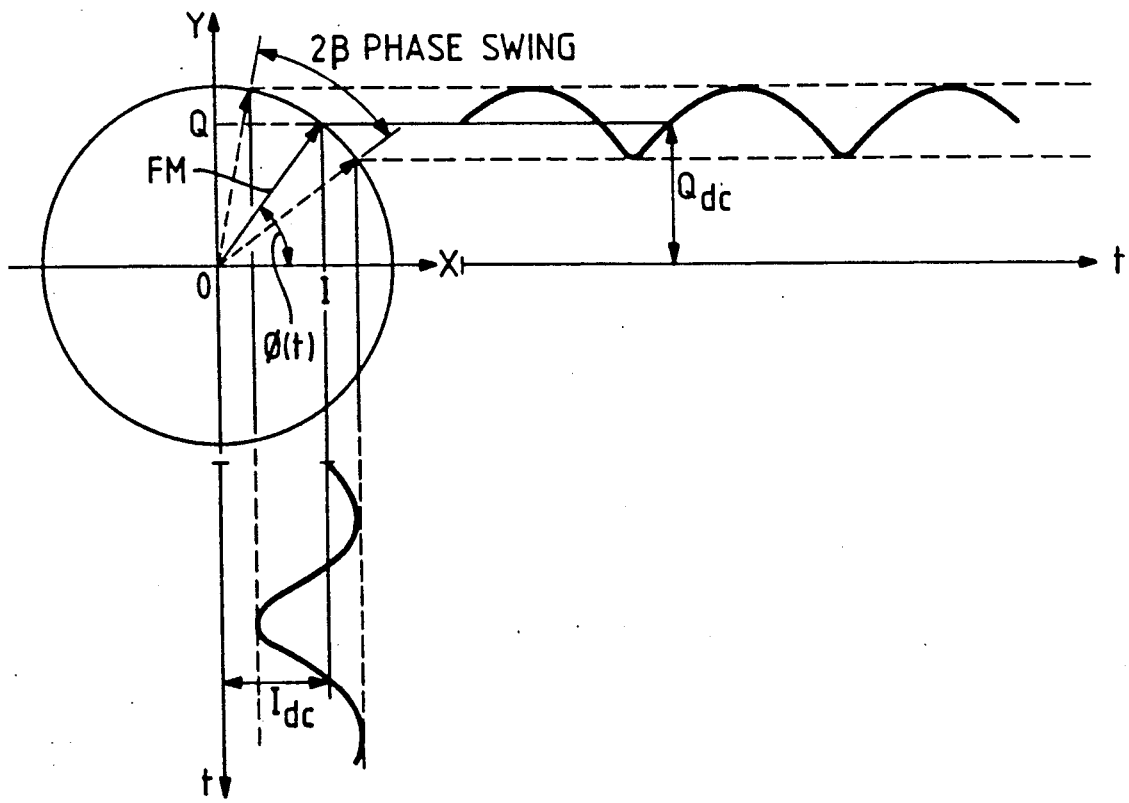
FIG. 2 is a phasor representation of the input signal and time waveforms of the I and Q channel signals in the d.c. coupled case.
Figure 3A:
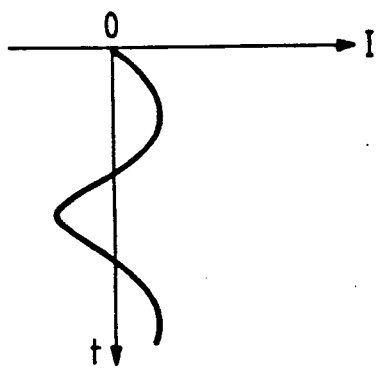
FIGS. 3a and 3b are respectively the time waveforms of the I and Q channel signals in the a.c. coupled case.
Figure 3B:
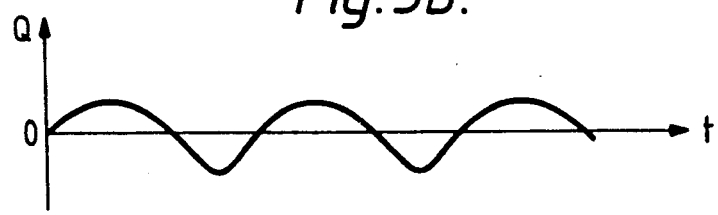

In order to facilitate an understanding of the present invention reference is made to FIGS. 2, 3a and 3b. FIG. 2 illustrates the situation where d.c. blocking is not used.

In the case of narrow band FM, the phase swing of the FM input signal $2\beta$ is small ($<2\pi$) and so the resulting output voltage from the mixer has a relatively small a.c. component superimposed on a large d.c. component (FIG. 2). This strong d.c. component is important in order to ascertain the phase angle $(\phi)t$ of the RF signal. To detect the phase with the arctan algorithm, the projections of the FM input signal on the X-axis (I(t)) and y-axis (Q(t)) have to be known. However when the I and Q channel signals are a.c. coupled, the projections of the FM input signal on the x- and y-axes will differ from the d.c. coupled situation (FIGS. 3(a) and 3(b)). These erroneous projections will result in an incorrect value of the phase being calculated, and hence an incorrect value of the frequency will be detected.

The presence of the differentiating circuits 26, 28 in the receiver shown in FIG. 1 was based on the realization that the d.c. component in FIG. 2 depends on the phase of the incoming carrier with respect to that of the local oscillator, and that with FM it is the rate of change of phase and not the absolute phase which carries the modulation. Thus the I and Q channel signals can be differentiated as an initial step in the processing. The receiver circuit of FIG. 1 can be analyzed as follows:

Any modulated signal can be represented by $$S(t) = A(t)\cos[\omega_c t + \phi(t)]$$

where
A(t) is the amplitude.
$\phi(t)$ is the phase.
and
$\omega_c$ is the angular carrier frequency.

This can be written in terms of in-phase and quadrature components as:

$$S(t) = I(t)\cos \omega_c t - Q(t)\sin \omega_c t$$

where
$I(t) = A(t)\cos \phi(t)$ and
$Q(t) = A(t)\sin \phi(t)$.

The phase of this signal is given by:

$$\phi(t) = \tan^{-1}\frac{(-Q(t))}{I(t)}$$

Differentiating $I'(t) = -A \cdot d\phi/dt \cdot \sin(\phi_o + \phi(t))$ and $Q'(t) = A \cdot d\phi/dt \cdot \cos(\phi_o + \phi(t))$.

Applying these signals to the arctan demodulator:

$$\frac{I'(t)}{Q'(t)} = -\tan[\phi_o + \phi(t)]$$

$$\tan^{-1}\left[\frac{I'(t)}{Q'(t)}\right] = -[\phi_o + \phi(t)]$$

$$d/dt\left[\tan^{-1}\left(\frac{I'(t)}{Q'(t)}\right)\right] = -d\phi/dt$$

where $d\phi/dt$ is the wanted signal.

Figure 4:
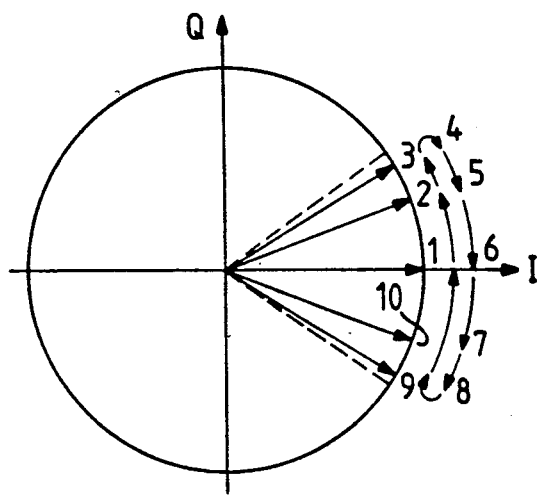
FIG. 4 is a phasor representation of the I and Q channel signals before differentiation.
Figure 5:
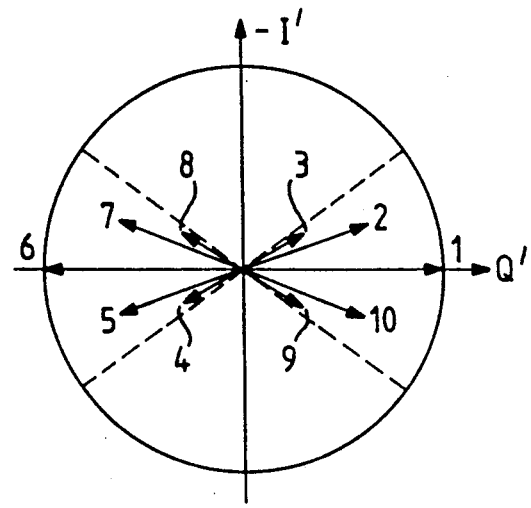
FIG. 5 is a phasor representation of the I' and Q' signals.

The provision of the differentiating circuits 26, 28 introduces two undesirable effects. The first of these will be described with reference to FIGS. 4 and 5. FIG. 4 shows the rotation of the phasor beginning at position 1 and proceeding sequentially to position 10 and then back to position 1. When the direction of rotation of the phasor reverses, such as between positions 3 and 4 and positions 8 and 9, phase jumps of 180 degrees will occur (FIG. 5) which in turn will lead to peaks in the output of the demodulator 20. These can be eliminated by ensuring that the phasor always lies in the region (−90 degrees, 90 degrees) which is unique to the arctan operation. In order to overcome this problem the circuit of FIG. 1 shows the provision of a peak detector 34 connected between the differentiating circuits 26, 28 and the inputs to the demodulator 20. In operation when the phase of the differentiated signals is between −180 degrees and −90 degrees or between 90 degrees and 180 degrees then the signs of the I' and Q' signals can be inverted thus rotating the phasor through 180 degrees and so placing it in the required region. As far as the demodulated signal is concerned this reversal of signs has no effect.

The second undesirable effect is that the provision of the differentiating circuits introduces frequency dependent amplitude scaling into the I' and Q' signals.

Figure 6:
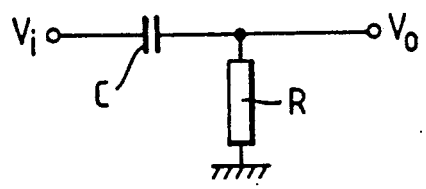
FIG. 6 shows a single pole RC network.

Differentiating the a.c. coupled I and Q channel signals gives:

$$I' = -d\phi/dt.Q = -f.Q$$

$$Q' = d\phi/dt.I = f.I$$

and thus the differentiation causes the I' and Q' channel signals to be linearly related to the frequency deviation f as well as to the I and Q channel signals. Therefore, when the frequency deviation approaches zero the I' and Q' signals are both close to zero because of their dependence on f. Phase distortion is also introduced by the a.c. coupling, which affects the I and Q signals. This can be illustrated by assuming that the a.c. coupling, indicated in FIG. 1 by the capacitors 16, 18, is implemented by analog high pass filters. FIG. 6 shows a single pole RC network which is the simplest filter which will a.c. couple a signal. The transfer function of this filter is given by $$H(j\omega) = \frac{j\omega CR}{1 + j\omega CR}$$

with a phase characteristic $$\arg H(j\omega) = \pi/2 - \arctan R\omega C.$$

Figure 7:
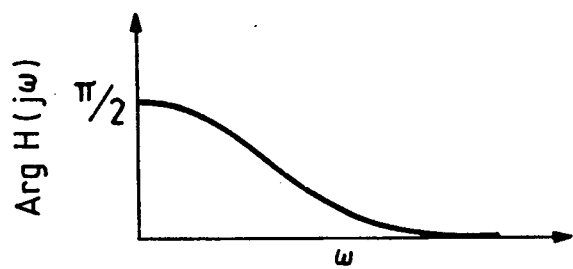
FIG. 7 is a graph showing the phase response of a single pole RC network.

The phase response is shown in FIG. 7. This shows that if the a.c. coupling is carried out with a single pole RC network, in addition to the loss of the d.c. component in the FM waveform, there is also a phase shift introduced. Since the phase shift is greatest when the frequency deviation approaches zero, the phase of the a.c. coupled I and Q channel signals will deviate the most from the d.c. coupled I and Q channel signals when the deviation is close to zero. These two effects, that is, the frequency dependent amplitude scaling and the phase distortion, are combined together since the I' and Q' signals are the products of the frequency deviation f and the I and Q signals. Thus when the frequency deviation is close to zero the I' and Q' signals will deviate most from the ideal.

Since the I and Q signals are in quadrature they will never have a zero crossing at the same time. Also since $$I' = -f.Q$$

and $$Q' = f.I$$

both the I' and Q' signals will be small only when the frequency deviation is very small. Therefore, the distortion can be reduced by setting a threshold close to zero in both the I' and Q' signals. When the I' and Q' signals are both below the threshold, it not only means that the demodulator output is not very reliable, but also that the output signal is very small. Thus a first method of reducing the distortion is to estimate the demodulator output until one of the two input signals exceeds the threshold again.

As the amplitude of both the I' and Q' signals will be below threshold when the frequency deviation is small, a possible estimate of the frequency deviation is to set it to zero. Thus the arctan demodulator is not used when it is likely to give an unreliable output.

Alternatively a second method of estimating the frequency deviation if the amplitudes of both the I' and Q' channels are below the threshold is to use a combination of setting the output to zero and interpolating between two more reliable values of the frequency deviation. For this estimation, two cases have to be distinguished. If it is assumed that the frequency deviation, derived from the values of the I' and Q' signals, just before both the I' and Q' signals go below threshold, is $f_1$, and that the frequency deviation, derived from the signal values of the I' and Q' signals, just after the amplitude of either one or both is above threshold again, is $f_2$, then if the sign of $f_2$ equals the sign of $f_1$, the values of the intermediate frequency deviations will be set to zero, and if the sign of $f_2$ is the opposite of the sign of $f_1$, the values of the intermediate frequency deviations will be linearly interpolated between $f_1$ and $f_2$.

In this way, the intermediate frequency deviations are derived directly from $f_1$ and $f_2$, and the arctan demodulator 20 is not used.

A limiting factor in the interpolation method is the number of samples which are below threshold and which have to be stored in a memory until at least one of the I' and Q' signals is above the threshold again. This can cause problems in a real time implementation, especially when there is not signal at the demodulator input. However, this problem can be solved by using combination of the first and the second method. This can be carried out as follows:

A counter will count how many samples are below the threshold. When the number of samples is more than a certain value, the output is set to zero until at least one of the I' and Q' signals is above the threshold again. Assume $f_0$ is the first frequency deviation which is set to zero and that both the I' and Q' channel signals continue to be below threshold. The intermediate frequency deviations between $f_1$ and $f_0$ will be linearly interpolated between $f_1$ and $f_0$ and then further examples are set to zero until either one or both of the I' and Q' signals exceed the threshold.

These estimations will cause a certain amount of distortion in the output signal when the input signals are below the threshold but, if the threshold is set at a sufficiently low level, this distortion should be considerably smaller than would have occurred if no threshold had been used.

An additional advantage gained by setting a threshold is that the algorithm will be more robust to noise. The circuit in which no threshold is set is very sensitive to noise, because the arctan (I'/Q') is most sensitive when the amplitudes of both the I' and Q' channel signals are very small. When a threshold is introduced, this will be avoided since the arctan function is not used when the amplitudes of both the I' and Q' channel signals are both very small.

Figure 8:
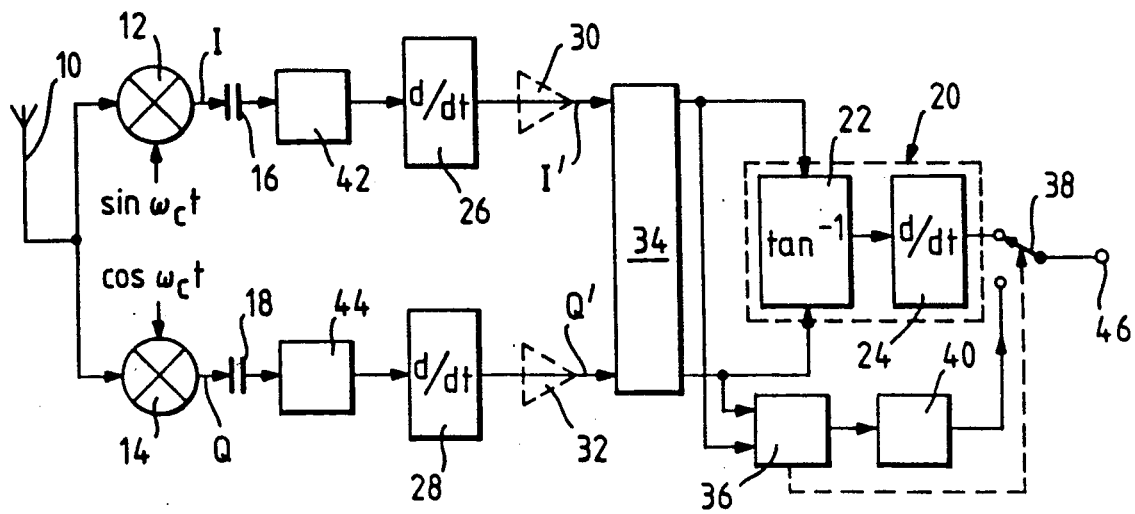
FIG. 8 is a block schematic diagram of another embodiment of the present invention.

FIG. 8 illustrates an embodiment of the present invention in which the I' and Q' signals are applied to a threshold detector 36. The detector 36 controls a switch 38 so that when the amplitudes of the I' and Q' signals are greater than the threshold set in the detector 36 the switch 38 is connected to pass the output of the demodulator 20, and when the amplitudes of both these signals are below the threshold the switch is changed over to provide an interpolated output and/or zero output having regard to the criteria mentioned above, which output(s) are provided by a linear interpolator/set zero element 40.

In FIGS. 1 and 8 the peak detector 34 may be located at any suitable point in the signal paths from the differentiating circuits 26, 28 to the demodulator 20. In FIG. 8, the inputs to the threshold detector 36 may be connected to the outputs of the differentiating circuits 26, 28.

The illustrated receiver is capable of digitally demodulating the FM signal. For the sake of completeness this will be described briefly. Thus I and Q signals are obtained as described with reference to FIG. 1 but after the d.c. blocking capacitors 16, 18 the analog signals are applied to analogue to digital converters 42, 44. The digitized output therefrom are applied to the first and second differentiating circuits 26, 28 each of which may comprise a Finite Impulse Response filter having say 4 sections and formed for example by a programmable digital signal processor. A digital to analog converter (not shown) is connected to an output 46 of the receiver.

Since an analog differentiating circuit will have a d.c. blocking function, the d.c. blocking capacitors may be omitted. However if there is a risk of the first and second differentiating circuits 26, 28 being saturated then it is preferable to have separate capacitors.

We claim:

1. A direct conversion receiver comprising an input for an FM signal, means coupled to the input for producing frequency down-converted quadrature related I and Q signals at baseband frequencies on respective first and second outputs, demodulating means having first and second inputs for receiving the I and Q signals and demodulating the information in the FM signal by obtaining the differential with respect to time of the arctan of the I and Q signals, and first and second differentiating means, said first and second outputs being coupled to the first and second differentiating means, respectively, and said first and second differentiating means having outputs coupled respectively, to said first and second inputs of the demodulating means.

2. A receiver as claimed in claim 1, characterized in that the first and second differentiating means comprise analog differentiators.

3. A receiver as claimed in claim 2, characterized in that said first and second outputs are a.c. coupled to the first and second differentiating means, respectively.

4. A receiver as claimed in claim 1, characterized in that the first and second differentiating means comprise digital differentiators, in that first and second analog to digital (A to D) converters are provided and are a.c. coupled to said first and second outputs, respectively, and in that outputs of the first and second A to D converters are connected respectively to said first and second differentiating means.

5. A receiver as claimed in claim 1, 2, 3 or 4, further comprising means comprising a peak detector coupled between said differentiating means and said demodulating means for inverting the signs of the differentiated I and Q signals whenever the phase of the differentiated signals is between −180 and −90 degrees and between 90 and 180 degrees.

6. A receiver as claimed in claim 1, 2, 3 or 4, further comprising threshold setting means coupled to said demodulator and means coupled to said demodulator for determining whether the amplitudes of the differentiated I and Q signals are less than the threshold set.

7. A receiver as claimed in claimed 6, further comprising means responsive to the amplitudes of the differentiated I and Q signals for setting the output of the demodulating means to zero when the amplitudes of the differentiated I and Q signals are less than the threshold set.

8. A receiver as claimed in claim 6, further comprising means responsive to the amplitudes of the differentiated I and Q signals for linearly interpolating between two predetermined values of the differentiated signals when the amplitudes of the differentiated I and Q signals are less than the threshold.

9. A receiver as claimed in claim 1, 2, 3 or 4, characterized in that the demodulating means comprises means for simulating an arctan using a CORDIC algorithm.

* * * * *